United States Patent

Sakazaki et al.

(10) Patent No.: US 6,344,655 B1
(45) Date of Patent: Feb. 5, 2002

(54) MULTICOLUMN CHARGED-PARTICLE BEAM LITHOGRAPHY SYSTEM

(75) Inventors: Tomohiro Sakazaki; Masami Takigawa, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/352,426

(22) Filed: Jul. 13, 1999

(30) Foreign Application Priority Data

Jul. 17, 1998 (JP) .......................................... 10-203649

(51) Int. Cl.[7] ......................... H01J 37/30; H01J 37/304
(52) U.S. Cl. ..................................... 250/492.2; 750/358
(58) Field of Search ............................... 250/492.2, 398

(56) References Cited

U.S. PATENT DOCUMENTS

| | | | |
|---|---|---|---|
| 4,430,571 A | 2/1984 | Smith et al. | 250/492.2 |
| 5,614,725 A | 3/1997 | Oae et al. | 250/492.22 |
| 6,107,636 A | * 8/2000 | Muraki | 250/398 |
| 6,137,113 A | * 10/2000 | Muraki | 250/492.22 |
| 6,218,060 B1 | * 4/2001 | Yasuda et al. | 250/492.22 |

FOREIGN PATENT DOCUMENTS

| | | |
|---|---|---|
| EP | 0 066 404 | 12/1982 |
| EP | 0 220 668 | 5/1987 |
| EP | 0 289 279 | 11/1988 |
| EP | 0 736 893 | 10/1996 |

\* cited by examiner

Primary Examiner—Bruce Anderson
(74) Attorney, Agent, or Firm—Christie, Parker & Hale, LLP

(57) ABSTRACT

Disclosed is a multicolumn charged-particle beam lithography system having the circuitry of a settlement wait time control unit thereof simplified. The settlement wait time control unit controls a settlement wait time to be spent by each of amplifiers connected to main deflectors necessary to realize concurrent exposure among columns. The charged-particle beam lithography system has a plurality of columns for patterning an exposed sample by deflecting and sweeping a charged-particle beam on the exposed sample according to expose pattern data. The charged-particle beam lithography system includes a settlement wait time control unit for controlling a settlement wait time to be spent by each of the amplifiers connected to the deflectors necessary to realize concurrent exposure among the columns. The settlement wait time control unit includes a circuit for comparing magnitudes of changes in deflection data items output from deflector adjusting circuits in the columns with one another and selecting a maximum value. The settlement wait time control unit further includes a circuit for determining a settlement wait time for all the columns according o the magnitude of a change of the selected maximum value.

3 Claims, 4 Drawing Sheets

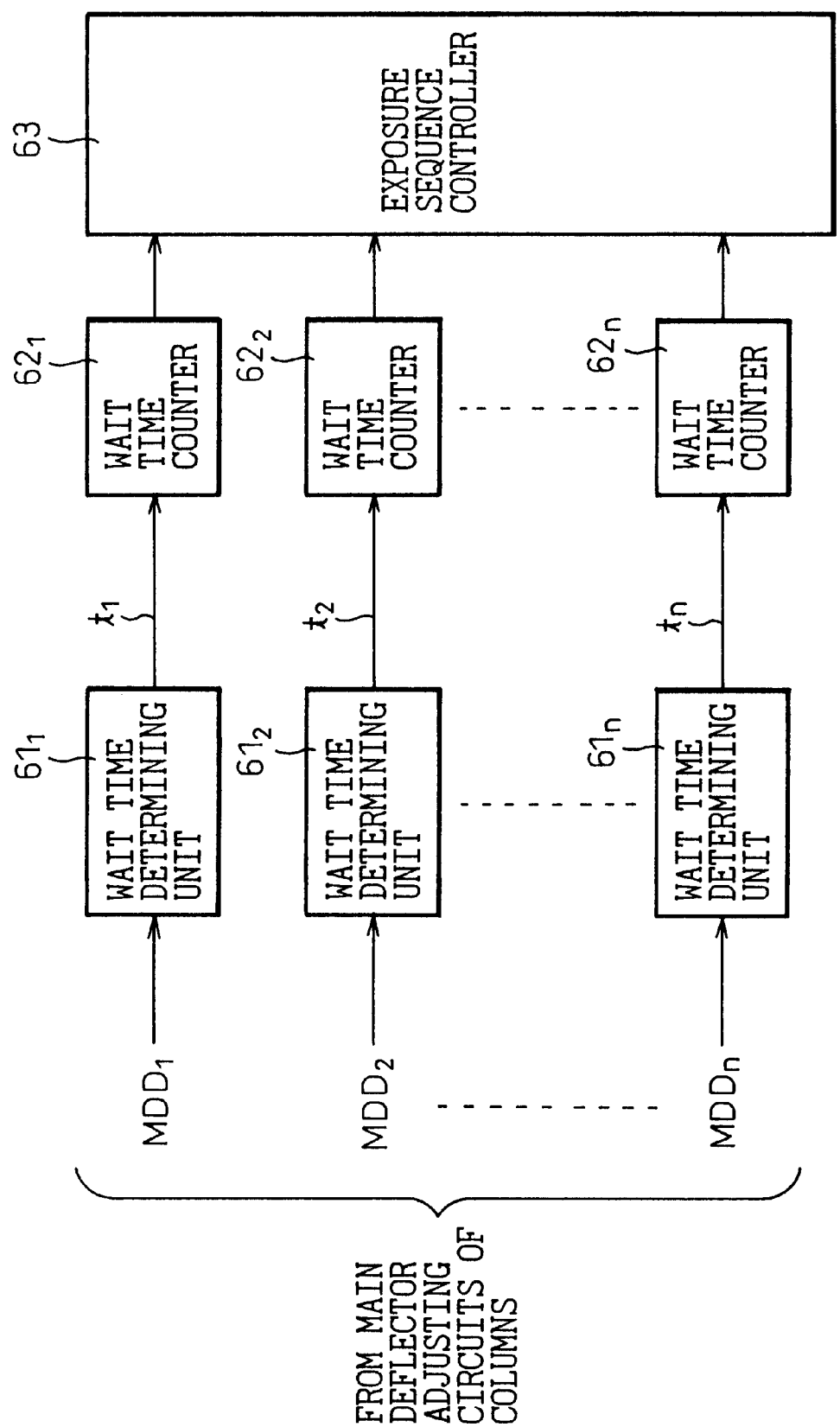

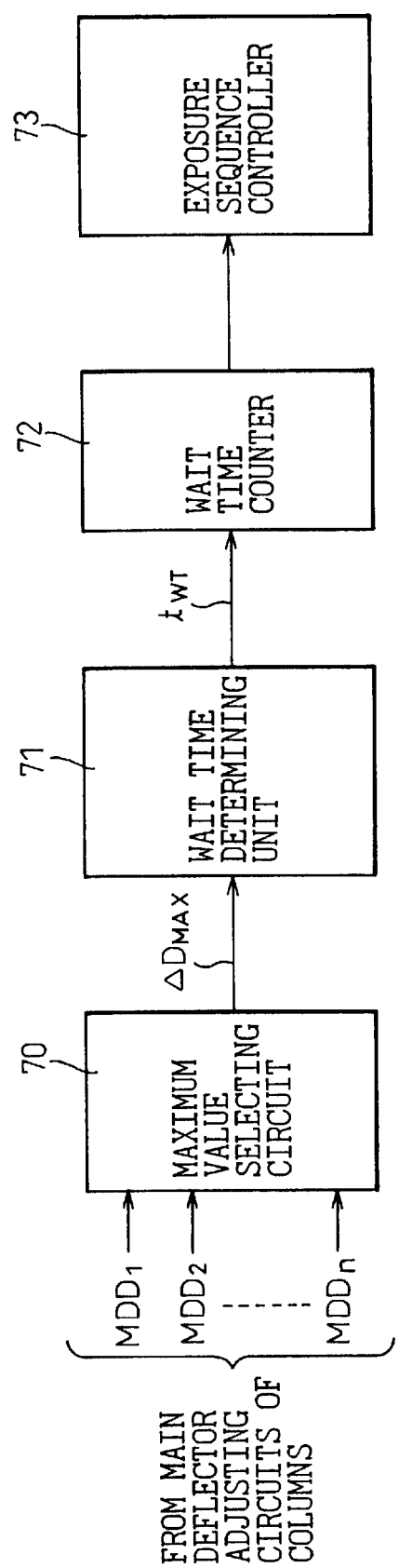

MULTICOLUMN CHARGED-PARTICLE BEAM LITHOGRAPHY SYSTEM

BACKGROUND OF THE INVENTION

1. Field of the Invention

The present invention relates to a lithography system employing a charged-particle beam such as an electron beam. More particularly, this invention is concerned with a technology for controlling a settlement wait time for each of the amplifiers connected to the main deflectors in a multicolumn charged-particle beam lithography system. Herein, the multicolumn charged-article beam lithography system has a plurality of columns for patterning an exposed sample (specifically a wafer) by deflecting and sweeping an electron beam on the wafer according to exposure pattern data.

2. Description of the Related Art

In recent years, a lithography method employing a charged-particle beam such as an electron beam or ion beam or a novel lithography method employing X rays has been studied and put to practical use. The method is expected to supercede photolithography, which was once the mainstream of fine patterning, due to the trend of producing integrated circuits with higher density elements. An electron-beam lithography system for patterning a wafer using an electron beam is characterized by a better resolution than that offered by a photolithography system. However, the electron-beam lithography system has the drawback of low throughput. For improving throughput, a block lithography method or blanking aperture array (BAA) method has been devised. Aside from these methods, a multicolumn electron-beam lithography system is thought to be effective. If the multicolumn electron-beam lithography system merely has an increased number of columns, it cannot be said that the lithography system gains an advantage over a plurality of conventional mono-column electron-beam lithography systems (for example, the one shown in FIG. 1) placed mutually adjacently. The multicolumn electron-beam lithography system is advantageous from a spatial viewpoint, though. If the multicolumn electron-beam lithography system is designed so that a control unit will be used in common and a pattern to be drawn is the same among the plurality of columns, the lithography system will prove effective.

However, if the columns differ from one to another, when the same signal is supplied to the columns so that the columns will expose wafers to draw the same pattern, a mismatch occurs among the columns. This poses a problem in that exposure cannot be achieved normally. A critical mismatch occurring among the columns is a mismatch among settlement times to be spent by main deflectors. The settlement time to be spent by a main deflector is the time required until a position of deflection to which the main deflector deflects light is modified and settled. The settlement time varies depending on the properties of a main deflector or a difference from a previous position of deflection. A settlement wait time control unit composed of a wait time determining unit and wait time counter is included in association with each column. However, this poses a problem in that the circuit scale of a lithography system expands.

SUMMARY OF THE INVENTION

An object of the present invention is to provide a charged-particle beam lithography system having the circuitry of a settlement wait time control unit simplified, and capable of contributing to improvement of efficiency in extending settlement wait time control for an amplifier included in a main deflector. The settlement wait time control unit controls a settlement wait time to be spent by each of amplifiers connected to main deflectors necessary to realize concurrent exposure among columns.

For accomplishing the above object, according to the present invention, there is provided a charged-particle beam lithography system having a plurality of columns for patterning an exposed sample by deflecting and sweeping a charged-particle beam on the exposed sample according to exposure pattern data. The charged-particle beam lithography system further includes a control unit for controlling a settlement wait time to be spent by each of amplifiers connected to main deflectors necessary to realize concurrent exposure among the columns. The control unit includes a circuit for comparing magnitudes of changes in deflection data output from main deflector, adjusting circuits included in the columns with one another and selecting a maximum value. The control unit further includes a circuit for determining a settlement wait time for all the columns according to the magnitude of a change of the selected maximum value.

According to the configuration of the charged-particle beam lithography system of the present invention, after a maximum value is selected from among the magnitudes of changes in deflection data, a settlement wait time is determined for all the columns according to the magnitude of a change of the maximum value. Wasteful counting actions for "double counting" that are carried out in related arts can be prevented. Moreover, only one circuit for determining the settlement wait time (wait time determining unit) is included in association with the columns. This leads to simple circuitry and contributes greatly to improvement of efficiency in extending settlement wait time control.

BRIEF DESCRIPTION OF THE DRAWINGS

Present invention will be more clearly understood from the description as set below with reference to the accompanying drawings, wherein:

FIG. 3 is a block diagram showing an example of configurations having a settlement wait time control unit, which controls a settlement wait time to be spent by an amplifier connected to a main deflector, included in one-to-one correspondence with each column; and FIG. 4 is a block diagram showing the configuration of a major unit of the multicolumn electron-beam lithography system in accordance with the embodiment of the present invention.

DESCRIPTION OF THE PREFERRED EMBODIMENT

A description will be made of an embodiment in which the present invention is implemented in a multicolumn electron-beam lithography system adopting a block lithography method.

The electron-beam lithography for drawing a pattern using an electron beam has a feature that the cross section of the electron beam can be narrowed down to several tens of nanometers. Another feature is that a fine pattern of 1 µm or less in width can be drawn. However, the lithography employing an electron beam is a drawing method of drawing a picture with one stroke. The finer a pattern becomes, the thinner the beam employed is. This leads to a very long exposure time. For overcoming this drawback, a block lithography method has been devised and put to practical use.

The block lithography method, that is a method of drawing repeated graphics, will be briefed below. Namely, a block mask having apertures bored therein for defining several basic patterns each of which serves as a unit pattern or a repeated graphic. A beam is transmitted by desired ones of the apertures of the block mask in order to produce unit patterns simultaneously. The patterns are projected on an exposed sample and linked. The block lithography method will prove very effective when basic fine patterns are repeatedly projected on almost all the area to be exposed.

Figure 1:
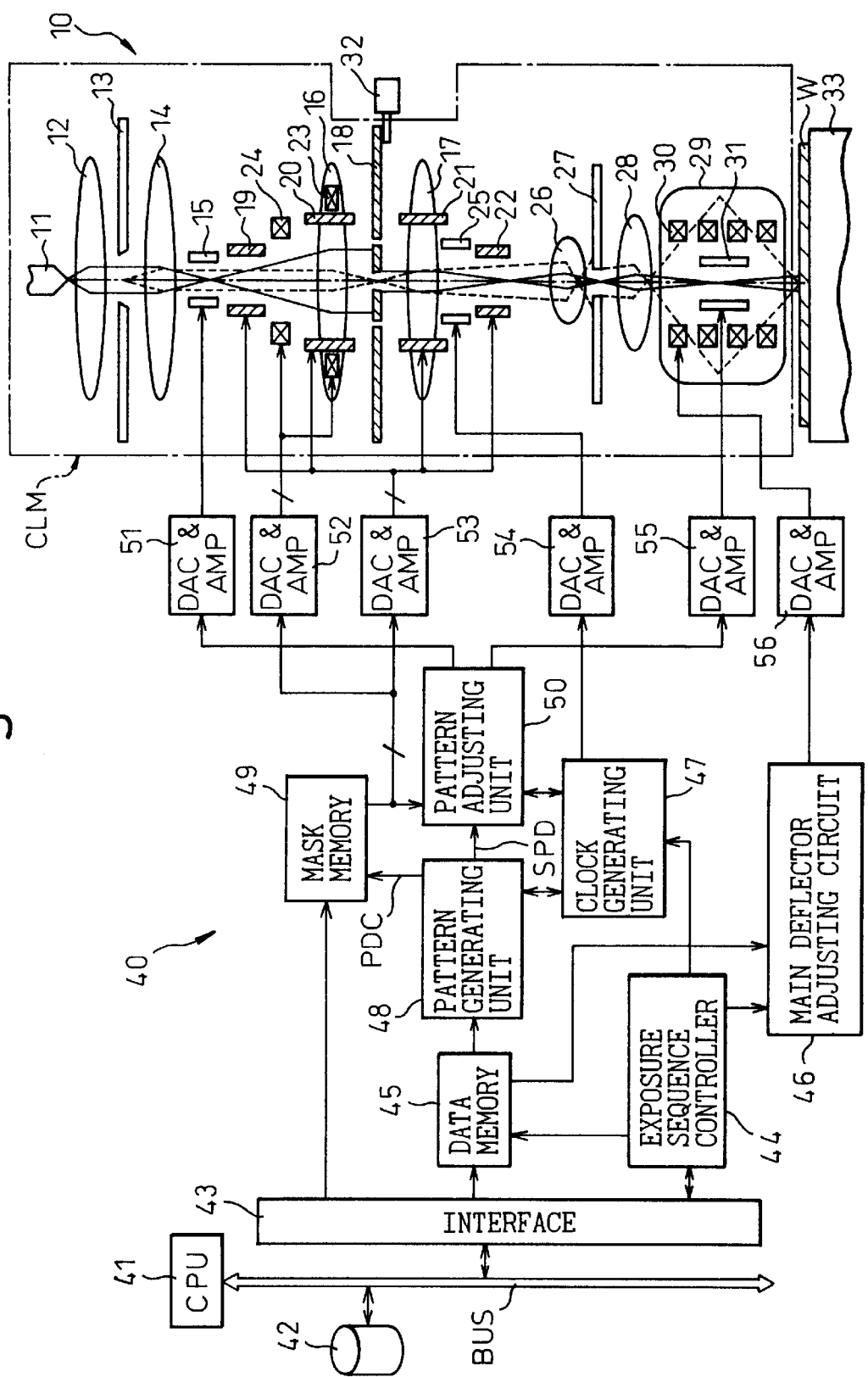
FIG. 1 shows a typical example of configurations of an electron-beam lithography system adopting a block lithography method while showing part of the configuration illustratively, wherein the electron-beam lithography system constitutes one column of a multicolumn electron-beam lithography system in accordance with an embodiment of the present invention.

FIG. 1 shows a typical example of configurations of an electron-beam lithography system adopting the block lithography method, wherein part of the configuration is shown illustratively.

As illustrated, the electron-beam lithography system consists of an exposure unit 10 and a control unit 40. A portion CLM enclosed with a dot-dash line is referred to as a column. The column CLM includes an electron gun 11, a lens 12, a mask 13, a lens 14, a deflector 15, lenses 16 and 17, a block mask 18, mask deflectors 19 to 22, a dynamic focusing coil and dynamic stinging coil 23 and 24, a blanking deflector 25, a lens 26, a mask 27, projection lenses 28 and 29, and a main deflector 30 and sub deflector 31. The electron gun 11 emits an electron beam. The lens 12 collimates the emitted electron beam into a beam of parallel rays. The mask 13 has an aperture for shaping the electron beam so that the electron beam will have a rectangular cross section. The lens 14 converges the shaped electron beam. The deflector 15 deflects an irradiated position on the block mask 18 at which the shaped electron beam is irradiated. The lenses 16 and 17 are opposed to each other along the path of the electron beam. The block mask 18 having apertures (a transmission pattern) for reshaping the electron beam so that the electron beam will have a desired cross section. The mask deflectors 19 to 22 select a desired transmission pattern by deflecting the electron beam on the block mask 18, and bringing the electron beam transmitted by the desired transmission pattern back to the original optical axis. The dynamic focusing coil 23 and dynamic stinging coil 24 deflect and correct the electron beam. The blanking deflector 25 intercepts or transmits the electron beam. The lens 26 reduces in size the cross section of the electron beam. The mask 27 has an aperture for reshaping the electron beam so that the electron beam will have a circular cross section. The projection lenses 28 and 29 irradiate the reshaped electron beam to an exposed sample (wafer W). The main deflector 30 and sub deflector 31 align the beam with a position on the wafer W.

Moreover, a mask stage 32 holds the block mask 18 and moves it in horizontal directions. A wafer stage 33 is movable in horizontal directions while having the wafer W mounted thereon. The wafer stage 33, not shown, is put in a chamber coupled to the column CLM with a vacuum in the interior thereof. The wafer stage 33 is connected to a means (laser interferometer) for detecting a horizontal position of the stage expressed by coordinates, and a stage moving mechanism for moving the stage according to the results of detection.

The control unit 40 includes a central processing unit (CPU) 41, a recording medium 42, an interface 43, an exposure sequence controller 44, a data memory 45, a main deflector adjusting circuit 46, a clock generating unit 47, and a pattern generating unit 48. The central processing unit 41 controls the whole of the electron-beam lithography system. The recording medium 42 is connected to the CPU 41 over a system bus BUS, and design data or the like concerning integrated circuits is stored in the recording medium 42. The interface 43 is connected to the CPU 41 over the system bus BUS. The exposure sequence controller 44 controls a general sequence of exposure according to exposure start/end information transferred from the interface 43. Data of a drawing pattern and data concerning the block mask 18 transferred from the interface 43 is stored in the data memory 45. Output of the data from the data memory 45 is controlled by the exposure sequence controller 44. The main deflector adjusting circuit 46 calculates a correction value according to main deflector deflection data read from the data memory 45 under the control of the exposure sequence controller 44. The correction value is used to correct the magnitude of a deflection made by the main deflector 30. The clock generating unit 47 generates a calculation clock and blanking clock, synchronously with which the whole lithography system functions, using exposure time data, exposure time correction data, and settlement wait time data. The data items are sent for each shot from the pattern generating unit and pattern adjusting unit. The pattern generating unit 48 responds to the calculation clock output from the clock generating unit 47, and designates one transmission pattern created by the block mask 18 according to data read from the data memory 45. The pattern generating unit 48 generates irradiated mask position data that indicates the position of the designated pattern on the block mask 18 (that is, a pattern data code PDC indicating which transmission pattern is used to draw a desired drawing pattern). Moreover, the pattern generating unit 48 generates exposed wafer position data indicating the position of the drawing pattern on the wafer W to be exposed (shot pattern data SPD concerning one beam irradiation). The control unit 40 further includes a mask memory 49, a pattern adjusting unit 50, a DAC & AMP (hereinafter, an amplifier for convenience sake) 51, amplifiers 52 and 53, an amplifier 54, and amplifiers 55 and 56. The mask memory 49 is a memory into which the relationship between the positions (pattern data codes PDC) of the patterns on the block mask 18 and associated deflection data items that have been measured in advance is fetched via the interface 43. The pattern adjusting unit 50 responds to the calculation clock sent from the clock generating unit 4. The pattern adjusting unit 50 then calculates a correction value using deflection data read from the mask memory 49 and shot pattern data SPD output from the pattern generating unit 48. The correction value compensates for a difference between the shapes of a drawing pattern and designated pattern. The amplifier 51 converts the correction value sent from the pattern adjusting unit 50 into analog data, amplifies the analog data, and outputs resultant data as corrected deflection data to the deflector 15. The amplifiers 52 and 53 convert deflection data read from the mask memory 49 into analog data, and amplify the analog data. The amplifiers 52 and 53 then output resultant data to the dynamic focusing coil 23, dynamic stinging coil 24, and mask deflectors 19 to 22. The amplifier 54 converts a blanking clock output from the clock generating unit 47 into analog data, amplifies the analog data, and outputs resultant data as a blanking signal to the blanking deflector 25. The amplifiers 55 and 56 convert correction values sent from the pattern adjusting unit 50 and main deflector adjusting circuit 46 into analog data, and amplify the analog data. The amplifiers 55 and 56 then output resultant data as corrected deflection data to the sub deflector 31 and main deflector 30.

Owing to the foregoing components, exposure is carried out as described below.

To begin with, data according to which exposure is performed is read from the recording medium 42 by the CPU 41 and stored in the data memory 45. An activation signal is sent from the CPU 41 to the exposure sequence controller 44, whereby exposure is started. First, main deflector deflection data stored in the data memory 45 is sent to the main deflector adjusting circuit 46. A correction value with which the deflection represented by the deflection data is corrected is calculated and given as corrected deflection data to the main deflector 30 via the amplifier 56. After an output value is settled, the exposure sequence controller 44 controls the clock generating unit 47 so that the clock generating unit 47 will generate a calculation clock and blanking clock. In response to the calculation clock, the pattern generating unit 48 reads block data and pattern data from the data memory 45. Based on the data, the pattern generating unit 48 generates a pattern data code PDC and shot pattern data SPD. Thereafter, deflection data associated with the pattern data code PDC is read from the mask memory 49 and input to the pattern adjusting unit 50. In response to the calculation clock, the pattern adjusting unit 50 calculates a correction value from the deflection data and the shot pattern data SPD output from the pattern generating unit 48. The data output from the pattern adjusting unit 50, the data read from the mask memory 49, and the blanking clock generated by the clock generating unit 47 are input to the associated amplifiers 51 to 55. The data items and clock are converted into analog data items, and amplified properly. Resultant data items are applied to the deflectors or coils.

On the other hand, an electron beam emitted from the electron gun 11 is collimated into a beam of parallel rays by the lens 12. After having passed through the rectangular aperture of the mask 13, the electron beam is converged by the lenses 14 and 16 and irradiated to the block mask 18. The irradiated electron beam is deflected properly on the block mask 18. Specifically, deflection of a relatively large range (approximately 5 mm) is performed on the block mask 18 by the mask deflectors 19 and 20. A desired transmission pattern created by the mask 18 is thus selected by the mask deflectors 19 and 20. Thereafter, deflection of a relatively small range (approximately 500 $\mu$m) is performed by the deflector 15. Thereafter, the electron beam having passed through the desired transmission pattern on the block mask 18 is brought back to the original optical axis by the mask deflectors 21 and 22, and converged by the lens 17. Thereafter, the electron beam is deflected and corrected by a beam correcting coil (dynamic focusing coil 23 and dynamic stinging coil 24), and transmitted by the blanking deflector 25. The electron beam then passes through the lens 26 to have its cross section reduced in size. After passing through the circular aperture of the mask 27, the electron beam is irradiated to the wafer W through the projection lenses 28 and 29 (the wafer is exposed). The electron beam irradiated to the wafer W is deflected by a large deflection range of about 2 mm by the main deflector 30. The electron beam is deflected by a small deflection range of about 100 $\mu$m by the sub deflector 31. At this time, the electron beam is turned on or off by the blanking deflector 25 in order to pattern the wafer W.

The electron-beam lithography system adopting the block lithography method has been described above. The basic configuration of an electron-beam lithography system adopting any other method (for example, the variable rectangle lithography method or blanking aperture array (BAA) lithography method) is identical to that of the foregoing electron-beam lithography system. Moreover, the operations exerted by an electron-beam lithography system adopting any other method are identical to those exerted by the foregoing electron-beam lithography system.

Along with the recent trend of integrated circuits toward a higher density of elements, the number of times of beam irradiation has reached ten mega-shots per chip or one giga-shots per wafer. The number of times of beam irradiation per a cycle is about 10 MHz. Even if the large number of shots is repeated quickly, improvement of throughput is limited. For this reason, the control unit for controlling the column is requested to process control steps more quickly. Moreover, development of a high-sensitivity resist serving as a resist to be applied to a wafer is an urgent need in terms of the exposure unit.

The electron-beam lithography system gains an advantage over the photolithography system due to a better resolution offered. However, the electron-beam lithography system has a drawback of low throughput. For improving throughput, the aforesaid multicolumn electron-beam lithography system is thought to prove effective. However, if the multicolumn electron-beam lithography system merely includes an increased number of columns, it cannot be said that the lithography system gains an advantage over a plurality of conventional mono-column electron-beam lithography systems placed mutually adjacently. The conventional mono-column electron-beam lithography system is, for example, like the one shown in FIG. 1. Consequently, the multicolumn electron-beam lithography system is designed so that a control unit will be used in common and a pattern to be drawn will be the same among the plurality of columns. Thus, the multicolumn electron-beam lithography system would prove effective.

Figure 2:
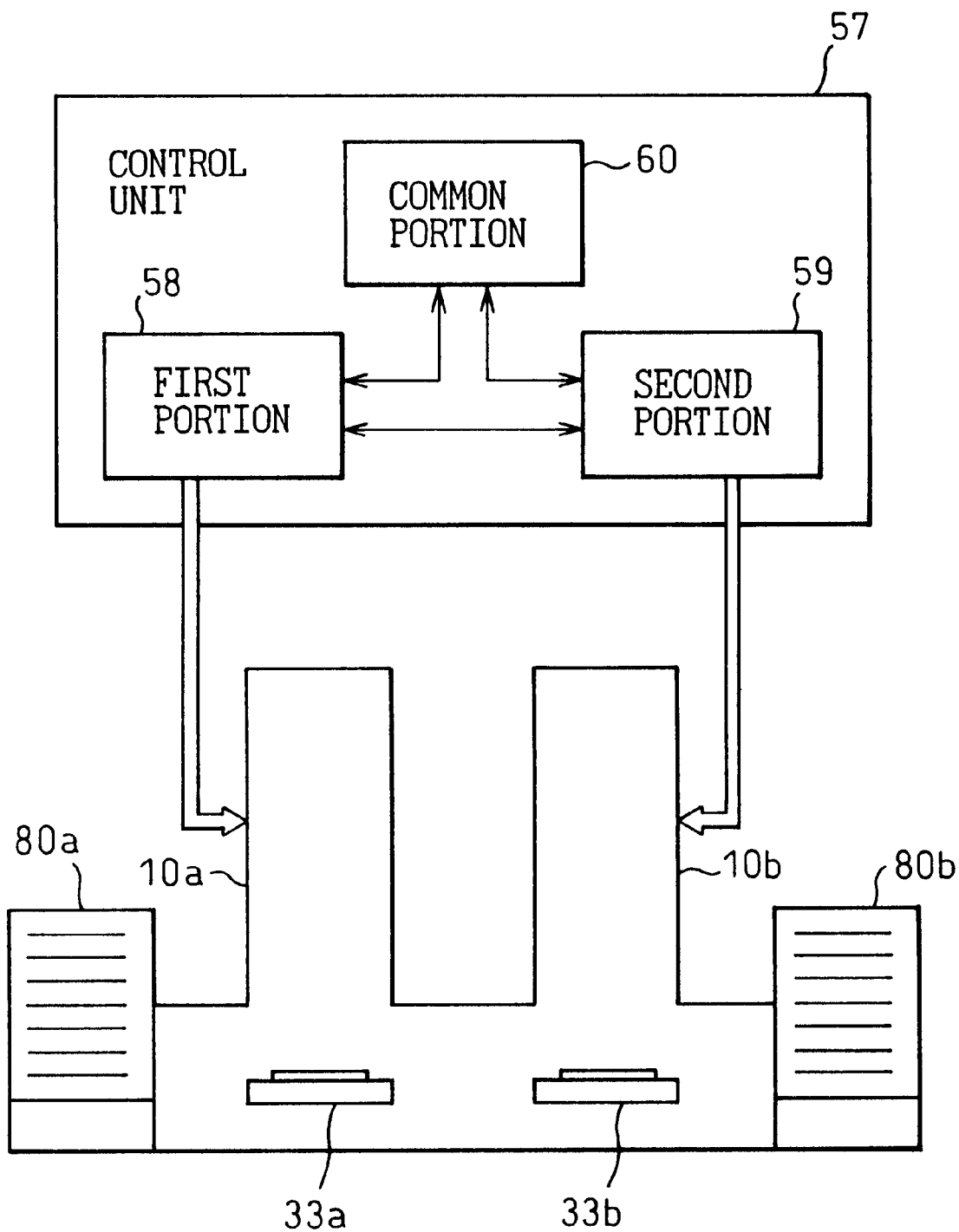
FIG. 2 shows the overall configuration of a multicolumn electron-beam lithography system in accordance with the embodiment of the present invention.

FIG. 2 is a block diagram showing the configuration of a multicolumn electron-beam lithography system in accordance with an embodiment of the present invention. Columns 10a and 10b of the multicolumn electron-beam lithography system of the embodiment have the same configuration as that described with reference to FIG. 1. Chambers and others are coupled to the columns. However, the chambers need not always be coupled thereto but may be separated therefrom. The columns 10a and 10b have wafer boxes 80a and 80b from which a wafer to be exposed is supplied and into which an exposed wafer is collected. The columns 10a and 10b are controlled by a common control unit 57. The control unit 57 has a first portion 58, a second portion 59, and a common portion 60. The first portion 58 performs processing specific to the column 10a. The second portion 59 performs processing specific to the column 10b. The common portion 60 performs processing that is common between the columns 10a and 10b. For brevity's sake, the number of columns is two. However, the multicolumn electron-beam lithography system of this embodiment shall have n columns.

The main deflector is, for example, an electromagnetic deflector including a coil and others. When a position of deflection to which a beam is deflected is changed, it takes much time until the position of deflection to which a beam is deflected is settled. The time required for settlement varies depending on the properties of the main deflector or a difference from a previous position of deflection. The conventional mono-column electron-beam lithography system therefore includes a settlement wait time control unit for calculating a settlement time from main deflector deflection data output from the main deflector adjusting circuit 46. When the settlement time elapses, a signal indicating the end of the settlement time is output to the exposure sequence controller 44. The exposure sequence controller 44 suspends exposure until it receives the signal. The settlement wait time control unit consists of a wait time determining unit for determining a wait time according to the main deflector deflection data and a counter for counting up to the determined wait time.

The main deflector is included in each column. It cannot be avoided that the main deflectors differ from one another in terms of properties. Even when positions of deflection to which a beam is deflected are changed by the same magnitude relative to all the main deflectors, a settlement time to be spent by one main deflector may be different from that to be spent by another. As far as the multicolumn electron-beam lithography system is concerned, it is thought to be necessary to include the settlement wait time control unit in one-to-one correspondence with each column.

FIG. 3 shows the configuration of a settlement wait time control unit included in one-to-one correspondence with each of columns constituting a multicolumn electron-beam lithography system in line with the foregoing idea.

Referring to FIG. 3, main deflector deflection data items MDD1 to MDDn are output from main deflector adjusting circuits 46 included in columns. Wait time determining units $61_1$ to $61_n$ respond to the associated main deflector deflection data items MDD1 to MDDn. Wait time counters $62_1$ to $62_n$ respond to outputs (time data items t1 to tn) of the associated wait time determining units $61_1$ to $61_n$. An exposure sequence controller 63 responds to the outputs of the wait time counters $61_1$ to $61_n$. The ability of the exposure sequence controller 63 is fundamentally identical to that of the exposure sequence controller 44 shown in FIG. 1.

Based on differences of the main deflector deflection data items MDD1 to MDDn output from the associated columns from immediately preceding main deflector deflection data items, the wait time determining units $61_1$ to $61_n$ determine settlement wait times (time data items t1 to tn) to be spent by the amplifiers connected to the associated main deflectors. The wait time counters $62_1$ to $62_n$ count up according to the associated time data items t1 to tn. When it is confirmed that counting is completed, an end flag is output to the exposure sequence controller 63 in order to thus indicate the end of a wait time.

The configuration of the settlement wait time control unit, which determines a settlement wait time to be spent by each of the amplifiers connected to the main deflectors, in the conventional multicolumn electron-beam lithography system has been described above. The wait time determining units $61_1$ to $61_n$ and wait time counters $62_1$ to $62_n$ are included in one-to-one correspondence with the columns. This poses a problem in that the circuit scale expands.

The settlement wait times determined by the wait time determining units $61_1$ to $61_n$ are based on the differences of associated main deflector deflection data items from preceding data items. Assuming that the difference is the same between the first column and the second column, the associated wait time counters $62_1$ and $62_2$ count up to the same time. Double counting is therefore performed. One wait time counter is used in vain.

FIG. 4 shows the configuration of a major unit of a multicolumn electron-beam lithography system in accordance with an embodiment of the present invention, that is, a settlement wait time control unit for controlling a settlement wait time to be spent by each of amplifiers connected to main deflectors.

Main deflector deflection data items MDD1 to MDDn are output from main deflector adjusting circuits included in columns (equivalent to the main deflector adjusting circuit 46). A maximum value selecting circuit 70 is a constituent feature of the present invention. The circuit 70 calculates differences of the main deflector deflection data items MDD1 to MDDn sent from the columns from immediately preceding main deflector deflection data items (ΔD1 to ΔDn), and selects a maximum value $\Delta D_{MAX}$. The difference data items ΔD1 to ΔDn are calculated according to |d1−d2|= ΔD where d1 denotes data output at a certain time instant and d2 denotes data output subsequently.

Moreover, a wait time determining unit 71 is a circuit for determining a settlement wait time (time data $t_{WT}$) for all the columns according to the difference data of the maximum value $\Delta D_{MAX}$. The wait time determining unit 71 has a memory (not shown) incorporated therein. Data indicating the relationships between predetermined settlement wait times and magnitudes of differences are stored in association with the properties of the amplifiers connected to the main deflectors in the columns.

Moreover, a wait time counter 72 responds to the output (time data $t_{WT}$) of the wait time determining unit 71. An exposure sequence controller 73 responds to the output of the wait time counter 72. The exposure sequence controller 73 has fundamentally the same ability as the exposure sequence controller 44 shown in FIG. 1.

The main deflector deflection data items MDD1 to MDDn output from the main deflector adjusting circuits included in the columns are input to the maximum value selecting circuit 70. The difference data items ΔD1 to ΔDn of deflection data items sent from the columns are calculated, and the maximum value $\Delta D_{MAX}$ is selected and output. The wait time determining unit 71 determines a settlement wait time (time data $t_{WT}$) dependent on the difference data of the maximum value $\Delta D_{MAX}$. by referencing the data indicating the relationships between settlement wait times and magnitudes of differences. The data is stored in the built-in memory. The wait time counter 72 counts up to the numerical value corresponding to the settlement wait time (time data $t_{WT}$). When it is confirmed that counting is completed, an end flag is output to the exposure sequence controller 73. In other words, it is notified that settlement of the amplifiers connected to the main deflectors in the columns has been completed.

The settlement wait time control unit for controlling a settlement wait time to be spent by each of the amplifiers connected to the main deflectors in the multicolumn electron-beam lithography system of this embodiment is configured as mentioned above. As is apparent from a comparison with the configuration shown in FIG. 3, although the maximum value selecting circuit 70 is included additionally, only the one wait time determining unit 71 and wait time counter 72 are included in association with the columns. Thus, the circuitry can relatively be simplified. Consequently, settlement wait time control can be extended efficiently.

Moreover, the maximum value $\Delta D_{MAX}$. of difference data items is selected in advance by the maximum value selecting circuit 70, and output to the wait time determining unit 71 and wait time counter 72. Wasteful counting actions for "double counting" can be prevented.

The embodiment has been described by taking the block lithography method for instance. As is apparent from the gist of the present invention, the present invention is not confined to any specific lithography method but can be adapted to, for example, the variable rectangle lithography method and blanking aperture array (BAA) lithography method.

Moreover, the embodiment has been described on the assumption that an electron beam is used as a charged-particle beam. The present invention is not restricted to the electron beam and, for example, an ion beam will do.

As described so far, according to the present invention, the circuitry of a settlement wait time control unit for controlling a settlement wait time to be spent by each of amplifiers connected to main deflectors in columns can be simplified. The main deflectors are necessary to realize concurrent exposure among the columns. Eventually, settlement wait time control can be extended efficiently.

What is claimed is:

1. A charged-particle beam lithography system having a plurality of columns for patterning an exposed sample by deflecting and sweeping a charged-particle beam on the exposed sample according to exposure pattern data, comprising:

a settlement wait time control unit for controlling a settlement wait time to be spent by each of amplifiers connected to main deflectors necessary to realize concurrent exposure among said columns, wherein said settlement wait time control unit includes a circuit for comparing magnitudes of changes in deflection data output from deflector adjusting circuits in said columns with one another and selecting a maximum value, and a circuit for determining a settlement wait time for all said columns according to the magnitude of a change of the selected maximum value.

2. A charged-particle beam lithography system according to claim 1, wherein said deflectors are electromagnetic deflectors.

3. A charged-particle beam lithography system according to claim 1, wherein said settlement wait time control unit includes a counter for counting up to the determined settlement wait time.

* * * * *